United States Patent
Doty et al.

(10) Patent No.: US 10,516,068 B1
(45) Date of Patent: Dec. 24, 2019

(54) THALLIUM BROMIDE (TIBR) SEMICONDUCTORS AND DEVICES WITH EXTENDED LIFE APPARATUS, METHODS, AND SYSTEM

(71) Applicant: National Technology & Engineering Solutions of Sandia, LLC, Albuquerque, NM (US)

(72) Inventors: F. Patrick Doty, Livermore, CA (US); Pin Yang, Albuquerque, NM (US); Xiaowang Zhou, Livermore, CA (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 0 days.

(21) Appl. No.: 15/862,307

(22) Filed: Jan. 4, 2018

Related U.S. Application Data

(60) Provisional application No. 62/542,127, filed on Aug. 7, 2017.

(51) Int. Cl.
| | |
|---|---|
| *H01L 21/02* | (2006.01) |
| *H01L 31/032* | (2006.01) |
| *H01L 21/441* | (2006.01) |
| *H01L 21/425* | (2006.01) |
| *H01L 21/465* | (2006.01) |
| *C30B 29/10* | (2006.01) |

(Continued)

(52) U.S. Cl.
CPC ............ *H01L 31/032* (2013.01); *C30B 11/00* (2013.01); *C30B 13/00* (2013.01); *C30B 15/00* (2013.01); *C30B 29/10* (2013.01); *C30B 33/08* (2013.01); *H01L 21/02521* (2013.01); *H01L 21/02595* (2013.01); *H01L 21/425* (2013.01); *H01L 21/441* (2013.01); *H01L 21/465* (2013.01); *H01L 29/24* (2013.01); *H01L 31/115* (2013.01)

(58) Field of Classification Search
CPC ..... H01L 31/032; H01L 29/24; H01L 31/115; H01L 21/465; H01L 21/425; H01L 21/02595; H01L 21/441; H01L 21/02521; C30B 11/00; C30B 13/00; C30B 15/00; C30B 33/08; C30B 29/10
See application file for complete search history.

(56) References Cited

U.S. PATENT DOCUMENTS

| | | |
|---|---|---|
| 7,157,716 B2 | 1/2007 | Kitaguchi et al. |
| 8,723,186 B2 | 5/2014 | Tuller et al. |

(Continued)

*Primary Examiner* — Selim U Ahmed
(74) *Attorney, Agent, or Firm* — Medley, Behrens & Lewis, LLC

(57) ABSTRACT

Various technologies pertaining to formation or treatment of a thallium bromide crystal to improve the operable lifespan of a device that incorporates the thallium bromide crystal are described herein. In exemplary embodiments, treatments including focused ion beam implantation, selective material removal, and buffer layer application are performed on a thallium bromide crystal to inhibit motion of dislocations toward a region at which an electrical contact is desirably installed. In other exemplary embodiments, a thallium bromide crystal is doped with impurities during formation that inhibit the motion of dislocations in the crystal. In still other exemplary embodiments, a thallium bromide crystal is formed by way of processes that inhibit dislocation formation during crystal growth or eliminate dislocations in an existing thallium bromide mass.

18 Claims, 11 Drawing Sheets

(51) Int. Cl.
*H01L 31/115* (2006.01)
*C30B 15/00* (2006.01)
*C30B 13/00* (2006.01)
*C30B 11/00* (2006.01)
*C30B 33/08* (2006.01)
*H01L 29/24* (2006.01)

(56) References Cited

U.S. PATENT DOCUMENTS

| | | |
|---|---|---|
| 9,194,958 B2 | 11/2015 | Leao et al. |
| 9,490,374 B1 | 11/2016 | Shah et al. |
| 2004/0079891 A1* | 4/2004 | Sato .................. G01T 1/24 250/370.12 |
| 2012/0153295 A1* | 6/2012 | Tuller .................. C01G 15/00 257/76 |
| 2013/0026364 A1* | 1/2013 | Conway .................. B32B 9/00 250/336.1 |
| 2014/0097349 A1* | 4/2014 | Leao .................. C30B 11/06 250/370.12 |
| 2014/0355745 A1 | 12/2014 | Kominami |
| 2018/0122713 A1* | 5/2018 | Voss .................. H01L 31/032 |

* cited by examiner

THALLIUM BROMIDE (TIBR) SEMICONDUCTORS AND DEVICES WITH EXTENDED LIFE APPARATUS, METHODS, AND SYSTEM

RELATED APPLICATION

This application claims priority to U.S. Provisional Patent Application No. 62/542,127, filed on Aug. 7, 2017, and entitled "THALLIUM BROMIDE (TlBr) SEMICONDUCTORS AND DEVICES WITH EXTENDED LIFE APPARATUS, METHODS, AND SYSTEM", the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Thallium bromide (TlBr) is a wide bandgap, high-atomic number semiconductor, giving it certain desirable properties for use in gamma ray detection and spectroscopy. For example, as compared with commercially available cadmium zinc telluride (CZT), TlBr has higher atomic number that yields a higher photoelectric absorption, and wider bandgap that potentially yields lower dark current, enabling low-noise detectors with greater thickness than may be realized in CZT.

Conventional gamma ray detectors and other devices incorporating TlBr semiconductor elements have faced limited usefulness as a result of aging processes that generally cause TlBr-based detectors to become inoperable after less than 6 months of continuous use at room temperature. Improvements in purity of TlBr materials used in gamma ray detectors have shown gains in detector efficiency, but have not yielded significant improvement in rates of aging of TlBr-based devices. Material polarization and contact-metal corrosion in TlBr-based devices have been believed to be caused by migration of vacancies in TlBr crystals, causing charge imbalances that result in polarization of the crystals themselves or chemical reactions between crystal ions and electrical contacts on the crystal that cause corrosion of the contacts.

SUMMARY

The following is a brief summary of subject matter that is described in greater detail herein. This summary is not intended to be limiting as to the scope of the claims.

Electro-migration of thermal and/or impurity-generated cation and anion vacancies in the crystalline structures of TlBr devices is insufficient to account for observed rates of aging in those devices. New simulations based upon a hybrid interatomic potential model coupled with a variable ionic charge model indicate that dislocations in TlBr crystals move in response to electric fields applied to the crystals. As these dislocations move, vacancies are created in the crystal lattice. These dislocation-generated vacancies are produced in greater quantities in a crystal than are present at room-temperature thermal equilibrium absent movement of the dislocations. Hence, the movement of dislocations within a TlBr crystal lattice can limit the operable lifetime of a device incorporating the TlBr crystal, as the vacancies created by this movement polarize the crystal and corrode its electrical contacts more rapidly than would otherwise occur.

Accordingly, various methods of manufacture or treatment of a TlBr crystal to inhibit formation or migration of dislocations within crystalline lattice structures of TlBr are described herein. For example, a treatment can be applied to a TlBr crystal in a vicinity of a desired location for installation of an electrical contact (e.g., a metal pad), where the treatment is configured to inhibit migration of dislocations in the TlBr crystal bulk adjacent to the desired location of the contact. In an exemplary embodiment, an ion beam is used to implant one or more material impurities in the TlBr crystal bulk in the vicinity of the desired location of the contact, where the one or more material impurities exert forces on dislocations to prevent them from migrating toward the desired location of the metal contact. In some embodiments, the material impurities are alloy impurities that are soluble in the TlBr crystal. In other embodiments, the material impurities are substantially insoluble in the TlBr crystal that precipitate to form particles.

In another exemplary embodiment, a buffer layer is applied to a surface of the TlBr crystal, and the electrical contact applied to the buffer layer. The buffer layer is configured to inhibit migration of dislocations to within a vacancy-diffusion-length of the contact, where the vacancy-diffusion-length is defined for desired operating parameters of the TlBr crystal such as temperature and bias voltage. By way of example, the buffer layer comprises an epitaxial film that comprises a material other than TlBr. In another example, the buffer layer comprises a polycrystalline layer of TlBr or other substance.

In still other exemplary embodiments, a TlBr crystal is formed according to techniques that limit formation of dislocations during manufacturing of the TlBr crystal, or that inhibit formation or migration of dislocations in the TlBr crystal subsequent to manufacturing. By way of an example, formation of dislocations during manufacturing of the TlBr crystal is limited by reducing or eliminating wall effects that exert forces on the TlBr crystal during manufacturing. For example, the TlBr crystal may be formed by a Czochralski process, a float zone or zone melting process. By way of other examples, a TlBr crystal is manufactured such that the resulting TlBr crystal includes one or more impurities that strengthen the TlBr crystal. For example, the TlBr crystal may be manufactured to include one or more alloy impurities that are soluble in the TlBr crystal lattice. In other examples, the TlBr crystal may be manufactured to include one or more particles that are insoluble in the TlBr crystal lattice.

In other embodiments, geometry of a TlBr crystal is modified in order to inhibit migration or formation of dislocations in the crystal. By way of example, an ion beam is used to damage the crystalline structure of the TlBr crystal in a region near a desired location of an electrical contact. This damage causes excess vacancies in the TlBr crystal that condense into extended defects which inhibit mobility of dislocations in the region of electrical contacts where substantial device aging might otherwise occur due to contact corrosion. For example, a plurality of surfaces may be created by forming voids in the TlBr crystal with a FIB.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
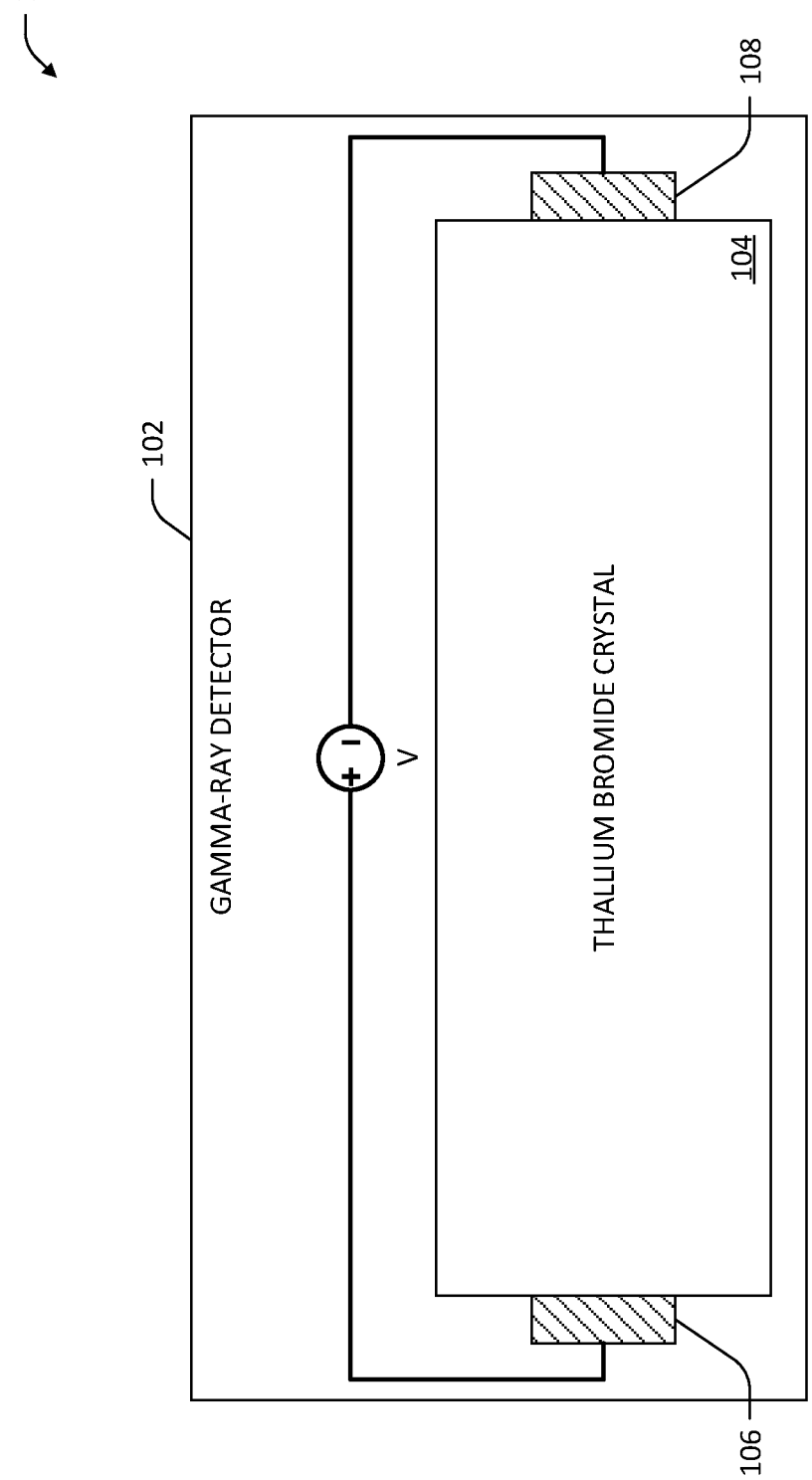
FIG. 1 is a diagram of an exemplary TlBr-based gamma-ray detector.

Various technologies pertaining to mitigation of aging effects in TlBr-based devices are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

In TlBr crystals, dislocations in the crystal lattice structure result from various aspects of processes used to manufacture the crystals, subsequent deformation or damage to the crystals, or other events that impart forces to the crystal and cause internal strains within the crystal lattice. In many practical TlBr-based devices, a TlBr crystal is subjected to a bias voltage that causes an electric field within the bulk of the TlBr crystal. The electric field exerts forces on charged dislocation cores within the TlBr crystal, causing dislocations to move along slip planes and to climb, thereby creating large numbers of vacancies within the TlBr crystal.

For example, and with reference now to FIG. 1, an exemplary gamma-ray detector 102 that comprises a TlBr crystal 104 is shown. Two metal contacts 106, 108 are shown attached to respective ends of the TlBr crystal 104, and a biasing voltage V is applied between the contacts 106, 108. The biasing voltage V establishes an electric field within the bulk of the TlBr crystal 104. In the exemplary gamma-ray detector 102, impingement of a gamma-ray photon on the TlBr crystal 104 excites a photoelectron in a depletion region of the TlBr crystal 104, which imparts energy sufficient to cause ionization of many electrons to move to the conduction band in the crystal 104. The electrons, and corresponding holes, are swept to the contacts 108 and 106, respectively, thereby causing a measurable signal output at the contacts 106, 108 that is indicative of a spectrum of gamma-ray energy that impinges on the TlBr crystal 104.

Figure 2A:
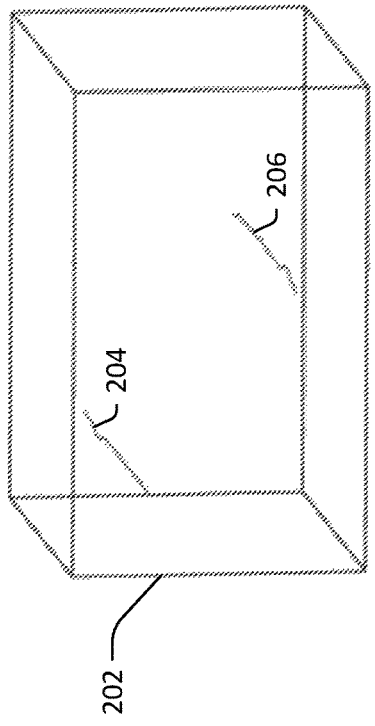
FIGS. 2A-2D are diagrams illustrating locations of mobile dislocations in a TlBr crystal that is subject to an applied electric field over a period of time.
Figure 2B:
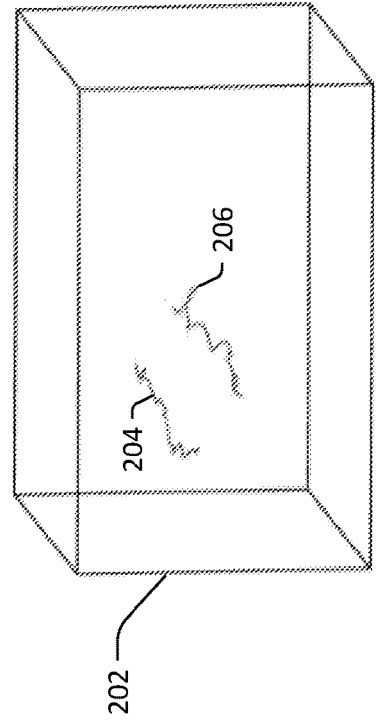
Figure 2C:
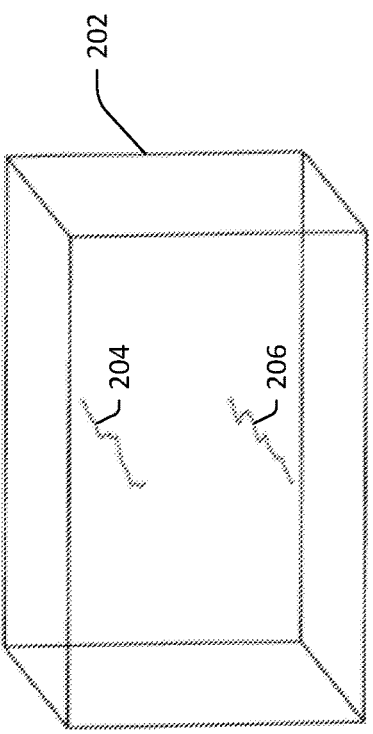
Figure 2D:
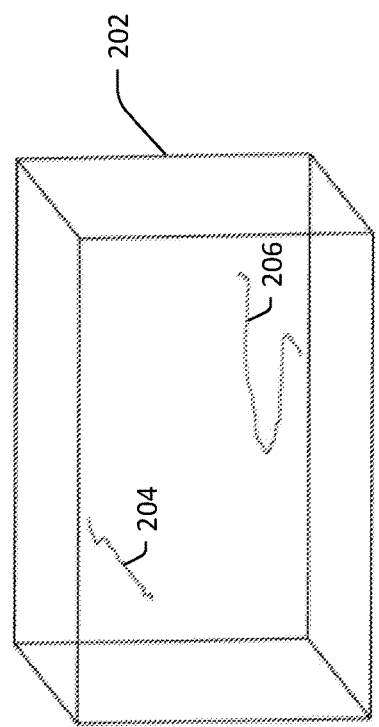

Dislocations in the lattice structure of the TlBr crystal 104 have charged cores. Dislocations therefore move in response to forces exerted on the dislocations by the electric field generated by the applied voltage V. Referring now to FIGS. 2A-2D, a plurality of conceptual views of an exemplary TlBr crystal 202 that is subject to an applied electric field are shown, which views depict locations of dislocations 204, 206, at a plurality of times $t_1$-$t_4$ that respectively correspond to the views in FIGS. 2A-2D. Locations of dislocations 204, 206 moving within the TlBr crystal 202 responsive to forces applied to the dislocations 204, 206 by the applied electric field are shown. Referring now solely to FIG. 2A, initial positions of the upper dislocation 204 and the lower dislocation 206 at a time $t_1$ are depicted. The upper dislocation 204 and the lower dislocation 206 initially have oppositely charged cores, and thus experience forces in opposite directions responsive to the same electric field being applied to the TlBr crystal 202. Referring now to FIG. 2B, subsequent positions of the upper dislocation 204 and the lower dislocation 206 are shown for a time $t_2$. From $t_1$ to $t_2$, the upper dislocation 204 travels leftward in the TlBr crystal 202, while the lower dislocation 206 travels rightward in the TlBr crystal 202. As the dislocations 204, 206 move, vacancies (not shown) are left behind in the TlBr crystal. Referring now to FIG. 2C, positions of the upper dislocation 204 and the lower dislocation 206 are shown for a time $t_3$. At $t_3$, the core of the lower dislocation 206 has changed its polarization and the lower dislocation 206 moves in the same leftward direction as the upper dislocation 204. Referring now to FIG. 2D, positions of the upper dislocation 204 and the lower dislocation 206 are shown for a time $t_4$. From $t_3$ to $t_4$, the upper dislocation 204 and the lower dislocation 206 move outside of their horizontal slip planes, exhibiting dislocation climb. The climb of the dislocations 204, 206 toward one another in response to resolved forces resulting from the applied electric field as well as local mechanical strain fields within the TlBr crystal 202 results in a number of vacancies in the lattice structure of the crystal 202 that is several times larger than the number of vacancies at thermal equilibrium.

Movement of dislocations within TlBr crystals in response to applied electric fields established within the TlBr crystals are believed to contribute to those crystals' aging and limited operable life spans by creating substantially more vacancies than would otherwise exist in the crystals at thermal equilibrium. As vacancies migrate in a TlBr crystal, polarization of the crystal occurs. Furthermore, when vacancies migrate to the vicinity of metal contacts that are attached to a TlBr crystal to facilitate operation of a TlBr-based device, the metal contacts are corroded by redox chemistry between the contacts and the TlBr crystal that occurs by virtue of the charge-imbalance created by the vacancies. Accordingly, various technologies are described herein that are directed toward reducing resolved electromotive forces on mobile defects in TlBr crystals, reducing the density of mobile dislocations in TlBr crystals, and/or reducing mobility of dislocations within TlBr crystals.

FIGS. 3, 4, 7, and 10 illustrate exemplary methodologies relating to inhibiting formation or mobility of dislocations within a TlBr crystal lattice. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Figure 3:
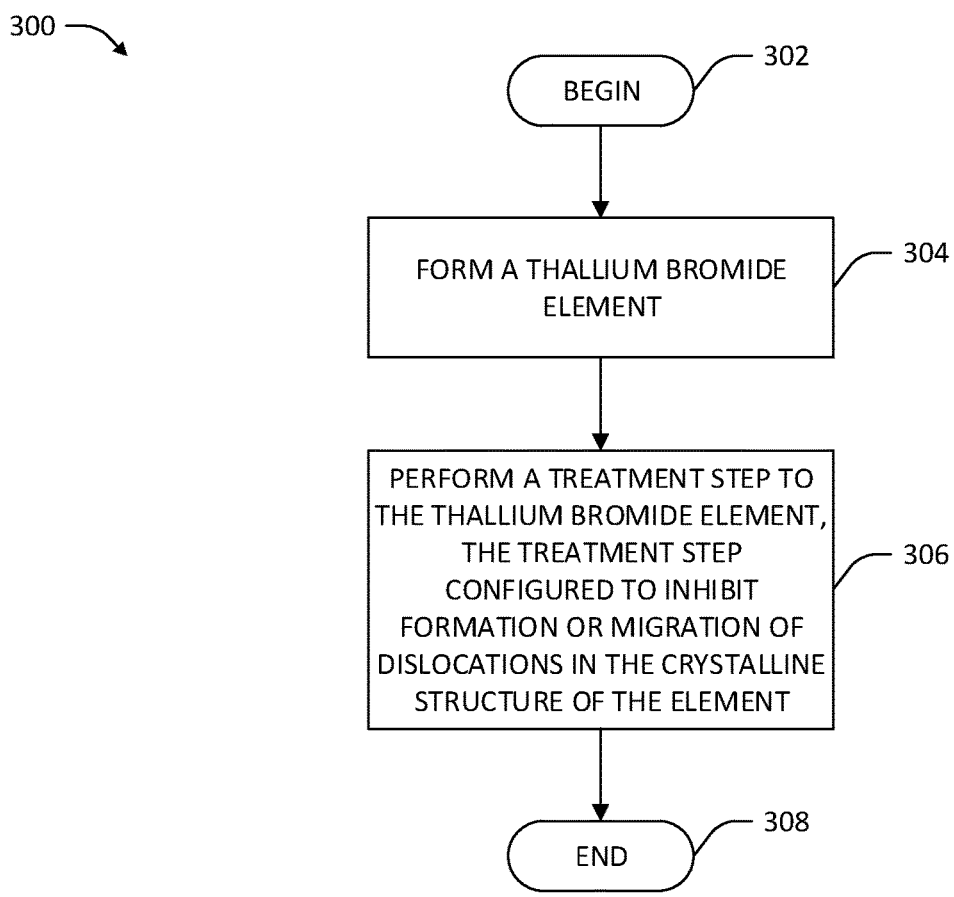
FIG. 3 is a flow diagram that illustrates an exemplary methodology for creating a TlBr element with an extended operable lifespan.

Referring now to FIG. 3, a methodology 300 that facilitates creation of TlBr crystal-based devices with longer operable life spans than conventional devices is illustrated. The methodology 300 begins at 302, and at 304 a TlBr element is formed. The TlBr element comprises a single- or poly-crystalline element of primarily TlBr by mass (e.g., at least 90% TlBr, at least 95% TlBr, at least 99% TlBr, etc.). The TlBr element may be formed by way of various techniques that inhibit formation of dislocations in the crystalline structure of the TlBr element. For example, the TlBr element may be formed according methods that mitigate forces exerted on a TlBr element by a wall of a crucible in which the TlBr element is grown.

In an exemplary embodiment, the TlBr element is formed by way of a Czochralski process wherein a seed crystal of TlBr is pulled from a crucible of molten TlBr. In another exemplary embodiment, the TlBr element is formed by way of a zone melting process. In the zone melting process, a starter TlBr element is heated above its melting point in a narrow region, where the starter TlBr element may be polycrystalline or relatively impure TlBr (e.g., <90% pure TlBr by mass). The narrow region of applied heating is moved from a first end of the starter TlBr element to a second end of the starter TlBr element along a length of the starter TlBr element, such that only a fraction of the starter TlBr element is molten at any given time in the zone melting process. The zone melting process results in a relatively pure (e.g., >99% pure TlBr by mass), single-crystal TlBr element with fewer dislocations than present in a TlBr element formed in a crucible and subject to stresses imparted by the walls of the crucible. In still other exemplary embodiments, a TlBr element may be formed according to a vapor growth process wherein powdered or polycrystalline TlBr is evaporated and transported through a vacuum to a cooling receptacle, whereupon a bulk TlBr crystal is formed in the receptacle.

In other examples, the TlBr element is formed with one or more impurities in order to strengthen the TlBr element as compared to a pure TlBr crystal element. For example, the TlBr element can be formed according to any of the processing techniques referenced above, and impurities added at appropriate points in the process to yield a desired distribution of impurities through a crystal lattice of the TlBr element, as would be understood by one of skill in the art. In an exemplary embodiment, TlBr in the TlBr element is alloyed with impurities that are soluble within the crystal lattice of the TlBr element (e.g., fluorine, chlorine, oxygen, etc.). The soluble impurities may be aliovalent or isovalent. In other exemplary embodiments, particles that are non-soluble in the crystal lattice of the TlBr element are incorporated into the TlBr element during the process of forming the TlBr element. Various impurities referenced above can inhibit formation of dislocations in the crystalline structure of the TlBr element by imparting strength that opposes internal strains that cause dislocations. The impurities can also inhibit mobility of dislocations in the crystalline structure of the TlBr element by exerting strain forces on the dislocations as they move. Aliovalent alloy impurities additionally create vacancy point defects in the crystal lattice of the TlBr element by virtue of the charge imbalance caused by the differing oxidation states of the aliovalent impurities and the ions (either $Tl^+$ or $Br^-$) that the aliovalent impurities replace in the crystalline structure of the TlBr element. These additional point defects may further inhibit dislocation movement.

In still other examples, the TlBr element is formed such that resolved electromotive forces that are applied to dislocations by electric fields within the TlBr element are reduced as compared to a parallelepiped-shaped TlBr element. For example, the TlBr element may be formed in various other shapes such as hemispherical or trapezoidal. In other exemplary embodiments, the TlBr element is formed such that an electric field applied to the TlBr element exerts forces on dislocations in the TlBr element in directions that are non-parallel with the orientation of the crystal lattice of the TlBr element.

Still referring to FIG. 3, at 306 a treatment step is performed on the TlBr element in order to inhibit formation of dislocations within the TlBr element or to inhibit migration of dislocations within the crystalline structure of the TlBr element, whereupon the methodology 300 ends at 308. In an exemplary embodiment, performing the treatment step comprises work hardening of the TlBr element to create dislocations that themselves inhibit mobility of other dislocations in the TlBr element. A resulting treated TlBr element may be incorporated into a TlBr-based device (e.g., the TlBr-based gamma ray detector 100) that has a greater operational lifespan than conventional TlBr-based devices. Various additional techniques pertaining to treating a TlBr element to reduce the density and/or mobility of dislocations within the TlBr element are now described.

Figure 4:
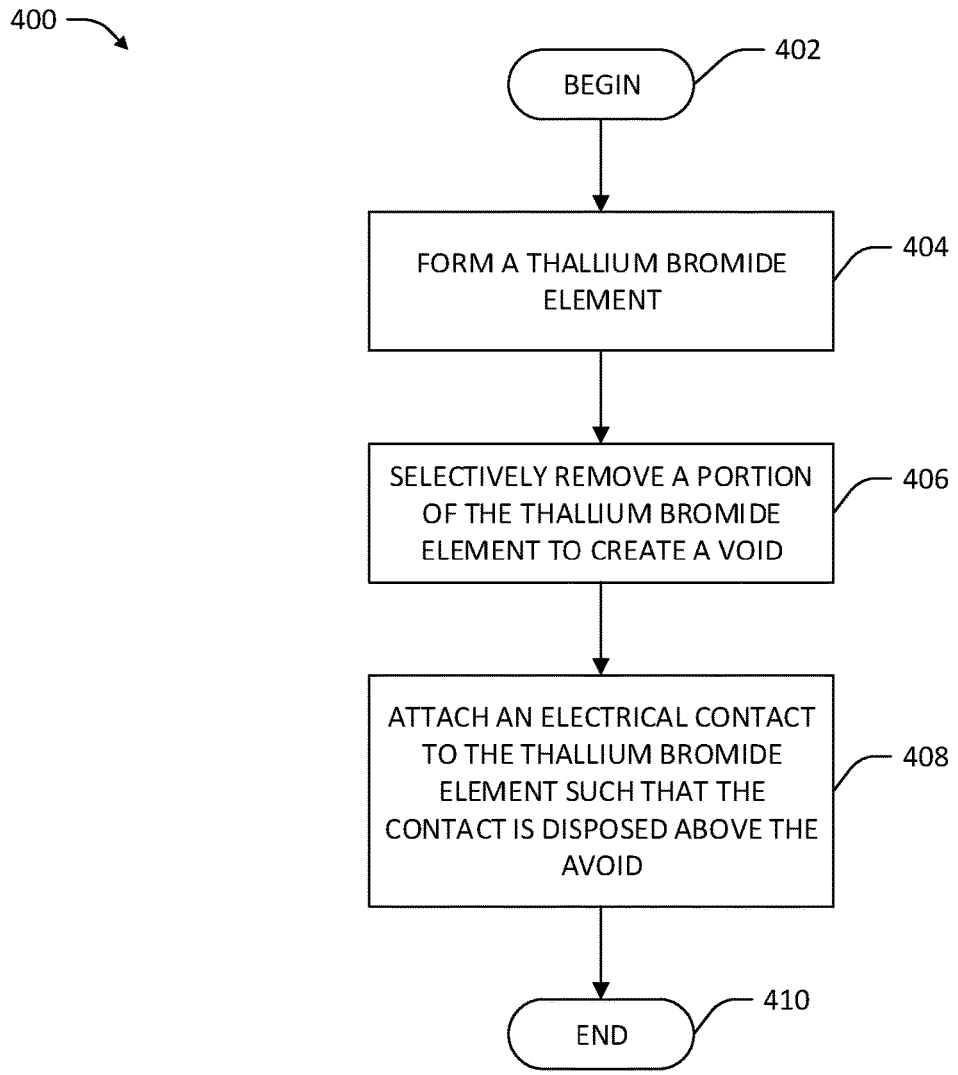
FIG. 4 is a flow diagram that illustrates an exemplary methodology for treating a TlBr element to inhibit formation or migration of dislocations in the element.

Referring now to FIG. 4, a methodology 400 for treating a TlBr element is shown. The methodology 400 begins at 402 and at 404 a TlBr element is formed. The TlBr element has a mono- or poly-crystalline structure. At 406, a portion of the TlBr element is selectively removed. In an exemplary embodiment, the portion is selectively removed by way of a FIB. In another exemplary embodiment, the portion is selectively removed by way of a chemical etching process. For example, a mask layer may be applied to a surface of the TlBr that is desirably etched, and mask material removed in a pattern according to where material is desirably removed from the TlBr element. Subsequently, selective chemical etching is performed, wherein the mask layer prevents etching of the TlBr element where the mask layer covers the TlBr element, and allows etching of the TlBr element where the mask material was previously removed.

Selective removal of the portion of the TlBr element at 406 is configured to create a void in the TlBr element, thereby creating additional surfaces of the TlBr element. In an exemplary embodiment, the void is disposed in the TlBr element in the vicinity of a surface region of the TlBr element on which an electrical contact is desirably installed. The surfaces of the void provide locations that are remote from electrical contacts where dislocations in the TlBr element can be eliminated, thereby reducing creation of vacancies in the vicinity of the contacts. In an example, the void is configured to cause mobile dislocations to eliminate at a surface of the void that is at least one vacancy-diffusion-length away from any electrical contact attached to the TlBr element. At 408 an electrical contact is attached to the TlBr element such that the electrical contact is disposed above the void created by the selective removal of the portion of the TlBr element at 406, whereupon the methodology 400 ends at 410. Accordingly, the methodology 400 facilitates creation of a treated TlBr element wherein dislocations in the TlBr element are inhibited from migrating close enough to electrical contacts of the element for dislocation-generated vacancies to migrate to the contacts.

Figure 5:
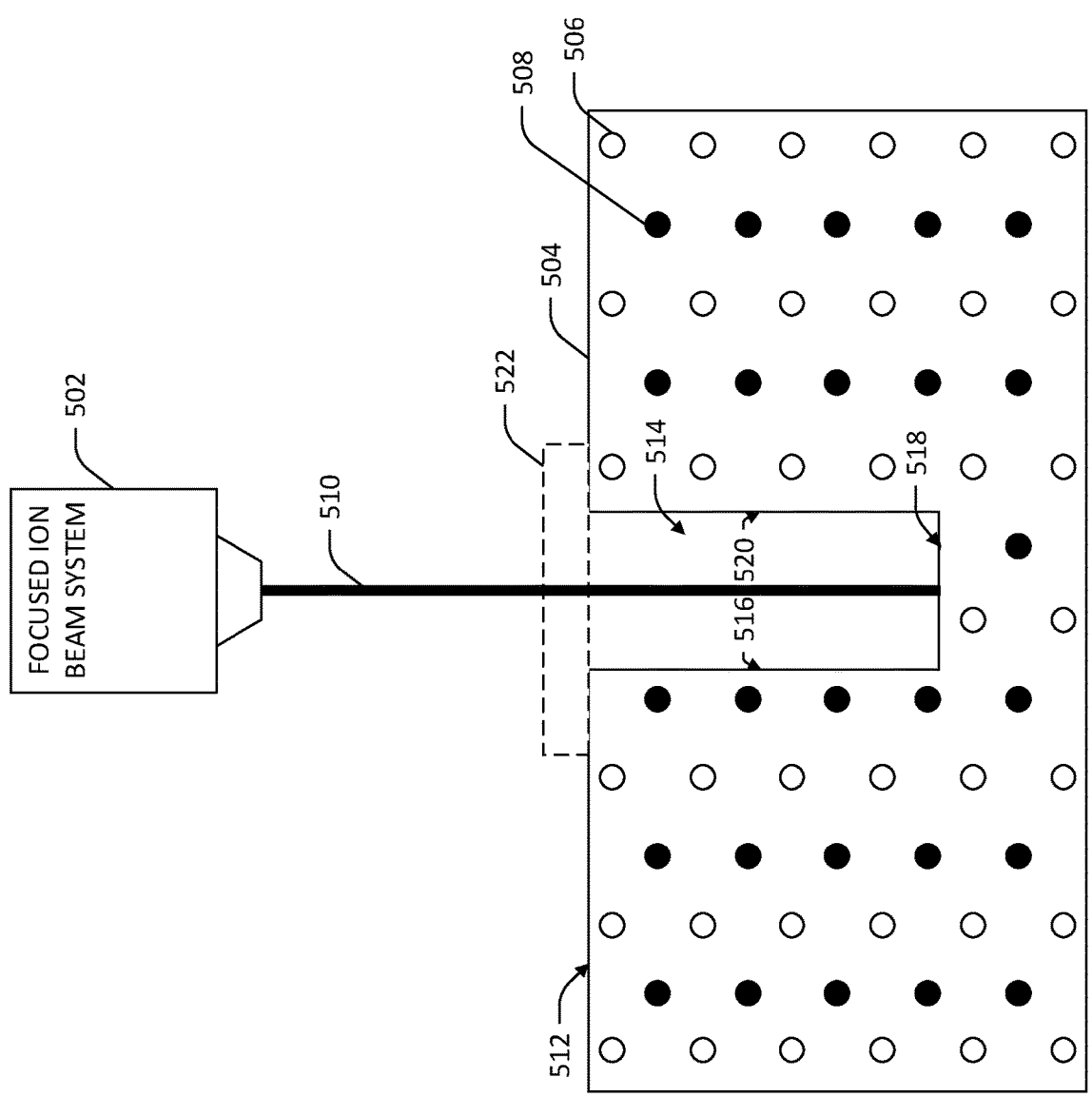
FIG. 5 is a diagram of an exemplary treatment of a TlBr element to inhibit formation or migration of dislocations in the element.
Figure 6:
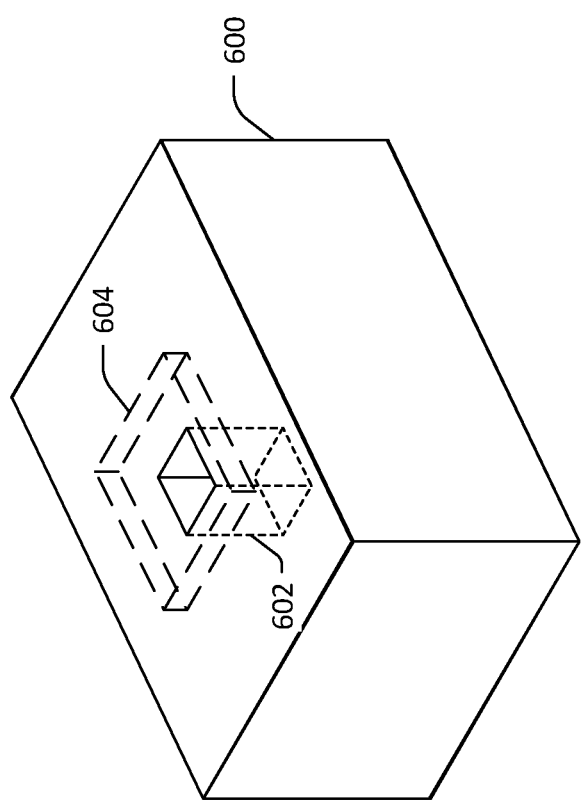
FIG. 6 is a three-dimensional diagram of the exemplary treatment of FIG. 5.

In an exemplary embodiment, and referring now to FIG. 5, an exemplary system 500 is shown wherein a FIB 502 selectively removes material from a TlBr element 504. The TlBr element 504 comprises thallium (Tl) ions 506 and bromine (Br) ions 508 arranged in a regular crystalline structure. The FIB 502 emits an ion beam 510 toward a surface 512 of the TlBr element 504. The ion beam 510 selectively removes material from the TlBr element 504, thereby creating a void 514 in the TlBr element 504. The void 514 comprises a plurality of surfaces 516-520. Mobile dislocations in the crystalline structure of the TlBr element 504 can eliminate at the surfaces 516-520, thereby inhibiting migration of dislocations in the TlBr element 504. A location 522 at which an electrical contact is desirably attached to the TlBr element 504 is also shown. In the exemplary system 500, the void 514 is disposed beneath the location 522 of the electrical contact. Referring now to FIG. 6, a three-dimensional view of an exemplary TlBr element 600 is shown wherein a three-dimensional void 602, created by way of selective removal of material from the TlBr element 600, is disposed within the TlBr element 600 below a location 604 where an electrical contact is desirably installed. The void 602 is configured to inhibit migration of dislocations to within a vacancy-diffusion-length of the location 604. It is to be understood that a plurality of additional voids may be similarly disposed within the crystal 600. For example, a plurality of voids may be arranged in a pattern around the location 604 at which the electrical contact is desirably installed, the pattern of voids configured to inhibit migration of dislocations to within a vacancy-diffusion-length of the location 604 of the electrical contact.

Figure 7:
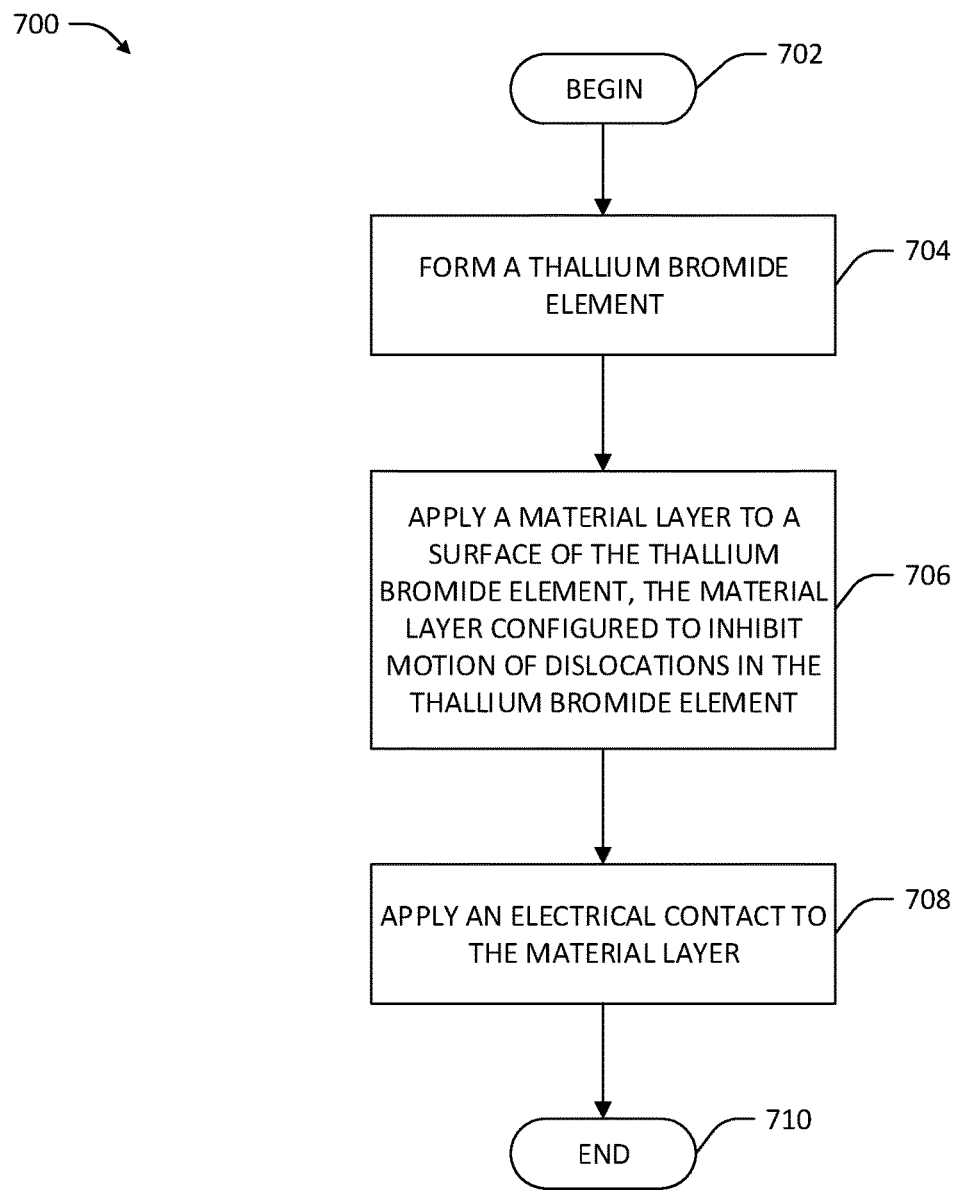
FIG. 7 is a flow diagram that illustrates another exemplary methodology for treating a TlBr element to inhibit formation or migration of dislocations in the element.

Referring now to FIG. 7, an exemplary methodology 700 for treatment of a TlBr element to inhibit mobility of dislocations in the TlBr element is illustrated. The methodology 700 begins at 702 and at 704 a TlBr element is formed. At 706, a material layer is applied to a surface of the TlBr element. The material layer is configured to inhibit motion of dislocations in the TlBr element toward electrical contacts attached to the TlBr element, such that vacancies created by movement of the dislocations are substantially prevented from reaching the contacts. At 708 an electrical contact is applied to the material layer, where the electrical contact serves as a contact point for applying a voltage to bias the TlBr element, whereupon the methodology 700 ends 710.

Figure 8:
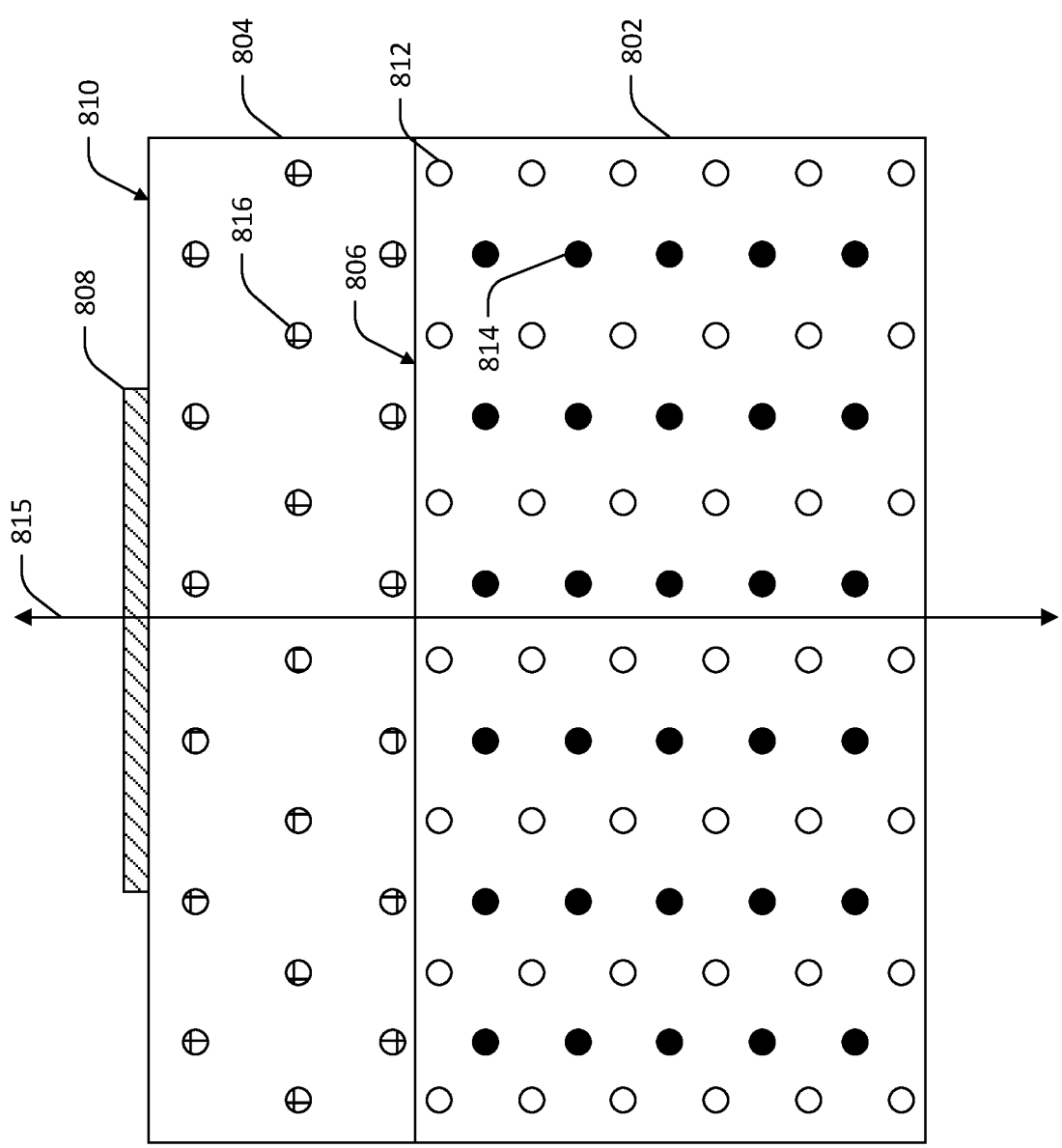
FIG. 8 is a diagram of another exemplary treatment of a TlBr element to inhibit formation or migration of dislocations in the element.

Various material layer applications are suitably employed in the methodology 700. For example, and referring now to FIG. 8, an exemplary TlBr-based device 800 is shown wherein the material layer comprises an epitaxial film. The TlBr-based device 800 comprises a TlBr element 802, an epitaxial film 804 that is applied to a surface 806 of the TlBr element 802, and an electrical contact 808 that is applied to a surface 810 of the epitaxial film layer 804. The TlBr element 802 comprises a plurality of Tl ions 812 and a plurality of Br ions 814 arranged in a crystal lattice oriented in a first direction 815. In the exemplary TlBr-based device 800 shown in FIG. 8, the epitaxial film 804 comprises a plurality of atoms or ions 816 arranged in a crystal lattice that is oriented in the same first direction 815 as the lattice of the TlBr element 802. In an exemplary embodiment, the epitaxial film 804 comprises a material other than TlBr, and has different equilibrium spacing between atoms in its crystal lattice than spacing between atoms in the crystal lattice of the TlBr element 802. The different equilibrium spacing of the atoms in the crystal lattice exerts forces that bend dislocations that extend from the TlBr element 802 to the epitaxial film 804. If the epitaxial film 804 is sufficiently thin, dislocations from the TlBr element 802 into the epitaxial film 804 are prevented from reaching the surface 810 of the epitaxial film 804 to which the electrical contact 808 is attached, or are prevented from migrating to within a vacancy-diffusion-length of the electrical contact 808. A necessary thickness of the epitaxial film 804 to prevent mobile dislocations from migrating to within a vacancy-diffusion-length of the electrical contact 808 may be experimentally determined and depends upon application-specific factors such as operating temperature, bias voltage across the TlBr element 802 (e.g., as applied by way of electrical contacts that are attached to the TlBr element 802 or material layers applied to the TlBr element 802 such as the epitaxial film 804), material composition of the epitaxial film 804, etc.

Figure 9:
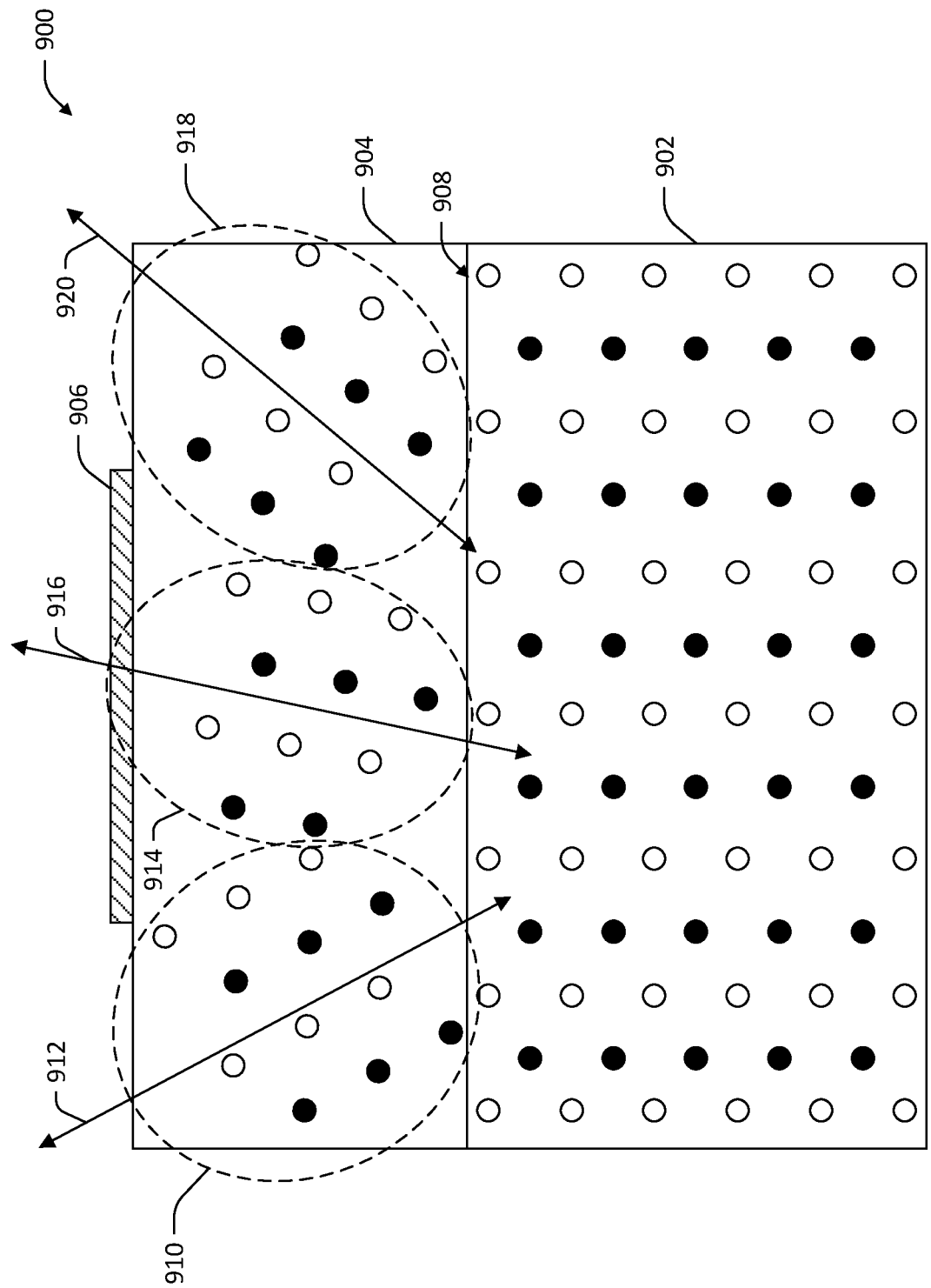
FIG. 9 is a diagram of still another exemplary treatment of a TlBr element to inhibit formation or migration of dislocations in the element.

By way of another example, and referring now to FIG. 9, an exemplary TlBr-based device 900 is shown wherein the material layer that is applied to the TlBr element is a polycrystalline material layer. The TlBr-based device 900 comprises a TlBr element 902, a polycrystalline layer 904, and an electrical contact 906. The polycrystalline layer 904 is applied to a surface 908 of the TlBr element 902. The polycrystalline layer 904 comprises a plurality of crystalline elements with different crystal orientations than the crystal lattice of the TlBr element 902. In the exemplary TlBr-based device 900 shown in FIG. 9, the polycrystalline layer 904 comprises a first crystalline element 910 with a first crystal orientation 912, a second crystalline element 914 with a second crystal orientation 916, and a third crystalline element 918 with a third crystal orientation 920, where the orientations 912, 916, 920 are different from an orientation of the crystal lattice of the TlBr element 902. The differing orientations 912, 916, 920 of the crystalline elements 910, 914, 918 cause forces that oppose the motion of dislocations from the TlBr element 902 into the polycrystalline layer 904. The polycrystalline layer 904 therefore inhibits motion of dislocations toward the electrical contact 906, thereby reducing the likelihood that dislocation-generated vacancies will migrate to the contact 906 and cause corrosion. In an exemplary embodiment, the crystalline elements 910, 914, 918 comprise TlBr. In another exemplary embodiment, the crystalline elements 910, 914, 918 comprise materials other than TlBr.

Various other material layer treatments may also be used. For example, a strained layer superlattice (SLS) may be applied to a TlBr element and an electrical contact applied to the SLS.

Figure 10:
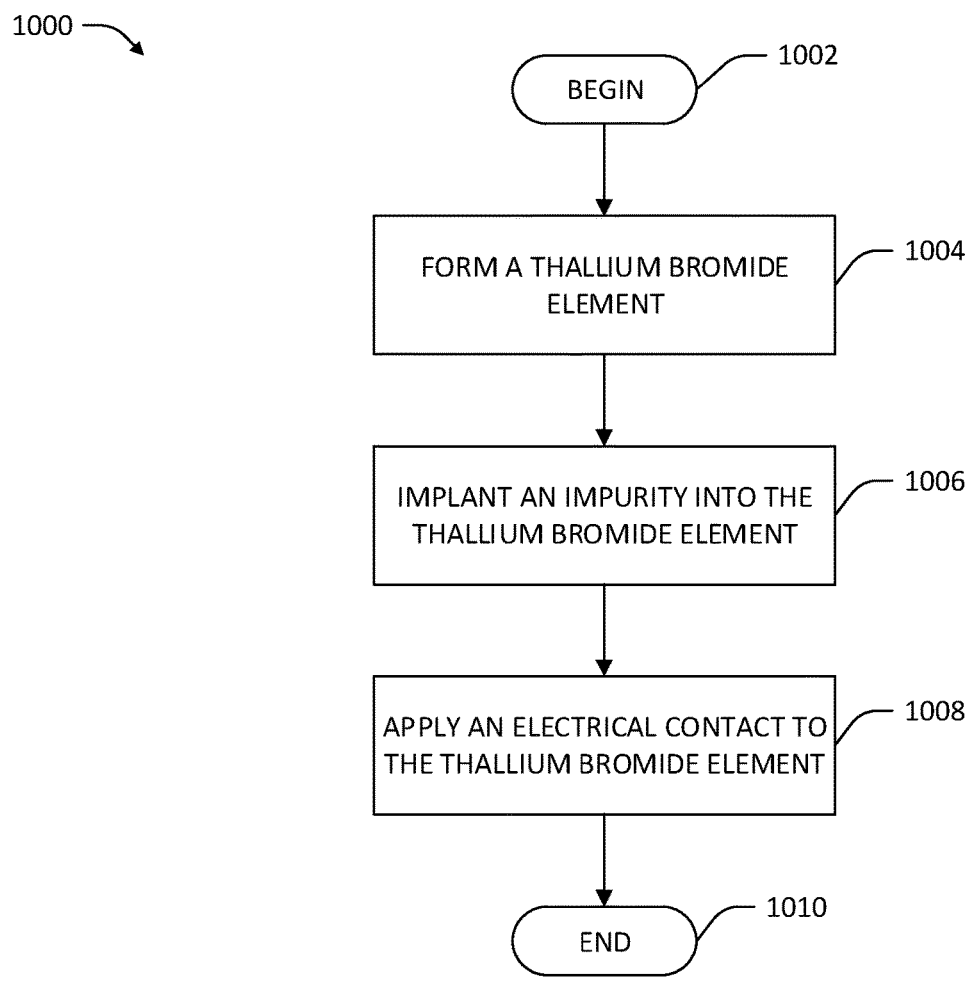
FIG. 10 is a flow diagram that illustrates still another exemplary methodology for treating a TlBr element to inhibit formation or migration of dislocations in the element.

Referring now to FIG. 10, another exemplary methodology 1000 pertaining to treatment of a TlBr element is illustrated. The methodology 1000 begins at 1002 and at 1004 a TlBr element is formed, wherein the TlBr comprises a crystal lattice of Tl and Br ions. At 1006, an impurity is implanted into the crystal lattice of the TlBr. By way of example, an ion beam is used to implant ions that are soluble in TlBr into the crystal lattice of the TlBr element in a volume surrounding a location in the TlBr element at which an electrical contact is desirably applied. Implantation of ions allows ion substitution in the crystal lattice of the TlBr element at deeper locations within the TlBr element than is feasible with surface treatments. In exemplary embodiments, the implanted ions may be ions that are isovalent in TlBr such as chlorine or fluorine ions. In other exemplary embodiments, the implanted ions may be aliovalent ions (e.g., oxygen). In some embodiments, implantation of aliovalent ions may result in precipitates forming in the TlBr element (e.g., thallium oxide when oxygen is implanted), which precipitates provide strengthening that further inhibits formation or mobility of dislocations within the TlBr element. By way of another example, particles that are insoluble in the crystal lattice of the TlBr element are implanted in the TlBr element, thereby providing particle strengthening of the TlBr element. At 1008, an electrical contact is applied to the TlBr element. In exemplary embodiments, the electrical contact is applied to the TlBr element near a region at which impurities were implanted into the TlBr element at 1006 (e.g., directly above implantation sites). The methodology 1000 completes at 1010.

Figure 11:
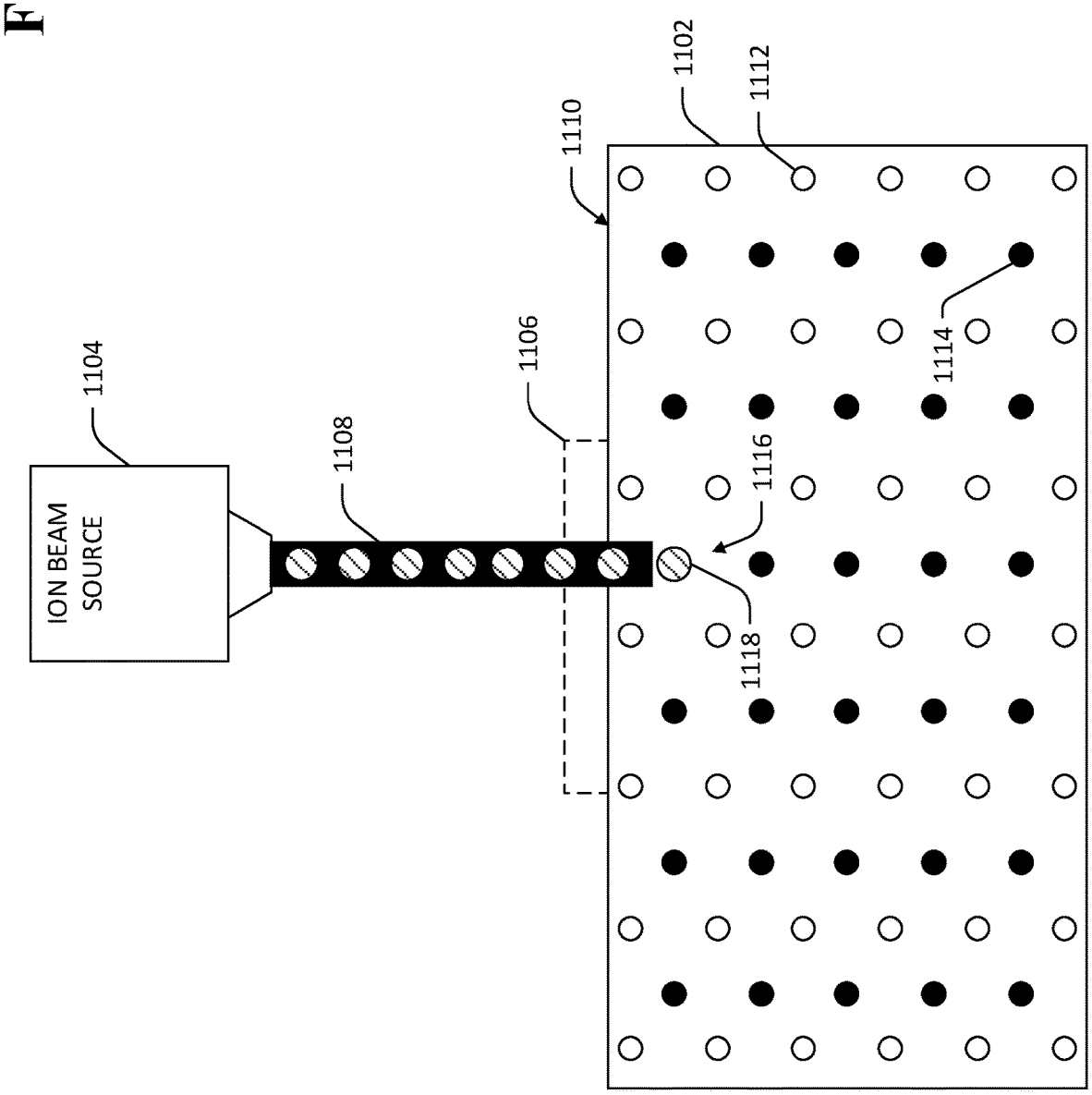
FIG. 11 is a diagram of yet another exemplary treatment of a TlBr element to inhibit formation or migration of dislocations in the element.

Referring now to FIG. 11, an exemplary TlBr element 1102 is shown, wherein an ion beam source 1104 is used to implant ions in the crystal lattice of the TlBr element 1102 below a location 1106 at which an electrical contact is desirably applied. The source 1104 emits a beam of ions 1108 that is directed toward a surface of the TlBr element 1102. The beam of ions 1108 displaces at least one of thallium ions 1112 or bromine ions 1114 in the crystal lattice of the TlBr element 1102. For example, as shown in FIG. 11, the beam of ions 1108 displaces a bromine ion at a first location 1116 in the lattice of the TlBr element 1102 with a substitute ion 1118, which may be either isovalent or aliovalent.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method, comprising:
    forming a thallium bromide element that has a crystalline structure; and
    performing a treatment step to the thallium bromide element, the treatment step configured to inhibit formation or migration of dislocations in the crystalline structure of the thallium bromide element, the treatment step comprising:
        implanting oxygen in a surface of the thallium bromide element by way of an ion beam.

2. The method of claim 1, further comprising attaching an electrical contact to the surface of the thallium bromide element, wherein the treatment step is configured to inhibit the formation or migration of the dislocation within a vacancy diffusion length of the electrical contact.

3. The method of claim 2, wherein performing the treatment step further comprises applying a material layer to the thallium bromide element prior to the attaching the electrical contact, wherein the electrical contact is subsequently attached to the material layer.

4. The method of claim 3, wherein the material layer comprises an epitaxial film.

5. The method of claim 3, wherein the material layer comprises a polycrystalline layer.

6. The method of claim 5, wherein the polycrystalline layer comprises polycrystalline thallium bromide.

7. The method of claim 1, wherein performing the treatment step further comprises implanting an impurity in the thallium bromide element.

8. The method of claim 7, the impurity comprising an ion, the ion soluble in the thallium bromide element.

9. The method of claim 8, wherein the ion is aliovalent in the thallium bromide element.

10. The method of claim 8, wherein the ion is isovalent in the thallium bromide element.

11. The method of claim 7, wherein the impurity is substantially insoluble in the thallium bromide element.

12. The method of claim 1, wherein performing the treatment step further comprises selectively removing a portion of the thallium bromide element.

13. The method of claim 12, wherein the portion is selectively removed by way of a focused ion beam (FIB).

14. The method of claim 12, wherein the portion is selectively removed by way of a masked etching process.

15. The method of claim 1, wherein forming the thallium bromide element comprises forming the thallium bromide element by way of a Czochralski process.

16. The method of claim 1, wherein forming the thallium bromide element comprises forming the thallium bromide element by way of a zone melting process.

17. The method of claim 1, wherein forming the thallium bromide element comprises forming the thallium bromide element by way of a Bridgman-Stockbarger method.

18. The method of claim 1, wherein performing the treatment step further comprises performing work hardening on the thallium bromide element.

* * * * *